United States Patent
Haller

(10) Patent No.: US 6,485,112 B1
(45) Date of Patent: Nov. 26, 2002

(54) ASSEMBLY, WITH LEAD FRAME, FOR ANTILOCK BRAKE SYSTEM AND ASSOCIATED METHOD

(75) Inventor: Mark D. Haller, Canton, MI (US)

(73) Assignee: TRW Inc., Lyndhurst, OH (US)

( * ) Notice: Subject to any disclaimer, the term of this patent is extended or adjusted under 35 U.S.C. 154(b) by 0 days.

(21) Appl. No.: 09/880,511

(22) Filed: Jun. 13, 2001

(51) Int. Cl.$^7$ .................................................. B60T 8/36
(52) U.S. Cl. ................................ 303/119.2; 303/113.1; 137/884; 335/299
(58) Field of Search ...................... 303/119.2, 119.1, 303/119.3, 113.1, 113.2; 137/884, 596.16, 596.17; 29/827, 847; 439/34, 639, 692; 251/129.15; 335/202, 219, 278, 299

(56) References Cited

U.S. PATENT DOCUMENTS

| | | | |
|---|---|---|---|
| 4,586,778 A | 5/1986 | Walter et al. | |
| 4,842,525 A | 6/1989 | Galloway et al. | |
| 4,929,038 A | 5/1990 | Reinartz et al. | |
| 5,040,853 A | 8/1991 | Burgdorf et al. | |
| 5,127,440 A | 7/1992 | Maas et al. | |
| 5,129,830 A | 7/1992 | Krajewski et al. | |
| 5,275,478 A | * 1/1994 | Schmitt et al. | 137/884 |
| 5,374,114 A | 12/1994 | Burgdorf et al. | 303/119.2 |
| 5,386,337 A | * 1/1995 | Schoettl | 174/52.2 |
| 5,439,279 A | 8/1995 | Linkner, Jr. et al. | |
| 5,449,227 A | 9/1995 | Steinberg et al. | 303/119.2 |
| 5,452,948 A | 9/1995 | Cooper et al. | 303/119.2 |
| 5,464,344 A | 11/1995 | Hufton | |
| 5,466,055 A | 11/1995 | Schmitt et al. | |
| 5,482,362 A | 1/1996 | Robinson | |
| 5,692,813 A | 12/1997 | Vellmer | |
| 5,715,595 A | 2/1998 | Kman et al. | |
| 5,758,931 A | 6/1998 | Hio et al. | |
| 5,845,672 A | 12/1998 | Reuter et al. | |
| 5,853,231 A | 12/1998 | Iwamura et al. | |
| 5,941,282 A | 8/1999 | Suzuki et al. | 303/119.3 |
| 6,059,382 A | 5/2000 | Schoettl | |
| RE36,828 E | 8/2000 | Tajima et al. | |
| 6,120,114 A | 9/2000 | Blazic et al. | |
| 6,124,772 A | 9/2000 | Heise | |

* cited by examiner

Primary Examiner—Pam Rodriguez
(74) Attorney, Agent, or Firm—Tarolli, Sundheim, Covell, Tummino & Szabo L.L.P.

(57) ABSTRACT

An assembly (20) is used with an anti-lock braking system (10) and is provided by an associated method. The assembly (20) includes a circuit board (30), a lead frame (40), and a plurality of solenoid coils (50). The lead frame (40) has a plurality of mechanical one-way connectors (42) for electrically connecting the circuit board (30) to the lead frame (40). The plurality of solenoid coils (50) is connected to the lead frame (50). Each of the plurality of solenoid coils (50) is electrically connected to the lead frame (40) such that each of the plurality of solenoid coils (50) is electrically connected to the circuit board (30).

7 Claims, 1 Drawing Sheet

ASSEMBLY, WITH LEAD FRAME, FOR ANTILOCK BRAKE SYSTEM AND ASSOCIATED METHOD

FIELD OF THE INVENTION

The present invention relates to an automotive anti-lock braking system and, more particularly, to a connector assembly for use with the automotive anti-lock braking system.

BACKGROUND OF THE INVENTION

A conventional anti-lock braking system integrates an electronic control assembly with the braking system's motor connector and main hydraulic control connector. The conventional main connector has a solenoid valve assembly press-fit onto valve stems in a separate hydraulic control unit. This assembly is, in turn, connected to an electronic controller via a lead frame.

Typically, pins on the motor connector and lead frame are mechanically fixed for alignment, set into position directly opposite one side of a circuit board, inserted into apertures on the one side of the circuit board, and then soldered directly to the opposite side of the circuit board of the electronic control assembly to electrically and mechanically secure them in place on the electronic control assembly.

An electronic control assembly that takes up less space while meeting all of the requirements of a conventional anti-lock braking system would beneficially reduce the space taken up by the entire anti-lock braking system.

SUMMARY OF THE INVENTION

In accordance with one feature of the present invention, an assembly is used with an anti-lock braking system. The assembly includes a circuit board, a lead frame, and a plurality of solenoid coils. The lead frame has a plurality of mechanical one-way connectors for electrically connecting the circuit board to the lead frame. The plurality of solenoid coils is connected to the lead frame. Each of the plurality of solenoid coils is electrically connected to the lead frame such that each of the plurality of solenoid coils is electrically connected to the circuit board.

In accordance with another feature of the present invention, an assembly is used with an anti-lock braking system. The assembly includes circuit board means, lead frame means, and a plurality of coil means. The circuit board means provides electrical connection and support to the anti-lock braking system. The lead frame means connects to the circuit board means. The lead frame means has a plurality of mechanical one-way connectors electrically connected to the circuit board means. The plurality of coil means controls respective valves of the anti-lock braking system. The plurality of coil means is connected to the lead frame means. Each of the plurality of coil means has connector means for electrically connecting to the lead frame means.

In accordance with still another feature of the present invention, a method secures solenoid coils of an anti-lock braking system. The method includes the step of mounting a plurality of the solenoid coils to a lead frame for electrically connecting the plurality of solenoid coils to the lead frame. The method further includes the step of mounting the lead frame to a circuit board for electrically connecting the lead frame to the circuit board. The mounting of the lead frame includes the step of inserting a plurality of mechanical one-way connectors into the circuit board.

BRIEF DESCRIPTION OF THE DRAWINGS

The foregoing and other features and advantages of the present invention will become apparent to those skilled in the art to which the present invention relates upon reading the following description with reference to the accompanying drawings, in which.

DESCRIPTION OF AN EXAMPLE EMBODIMENT

Figure 1:
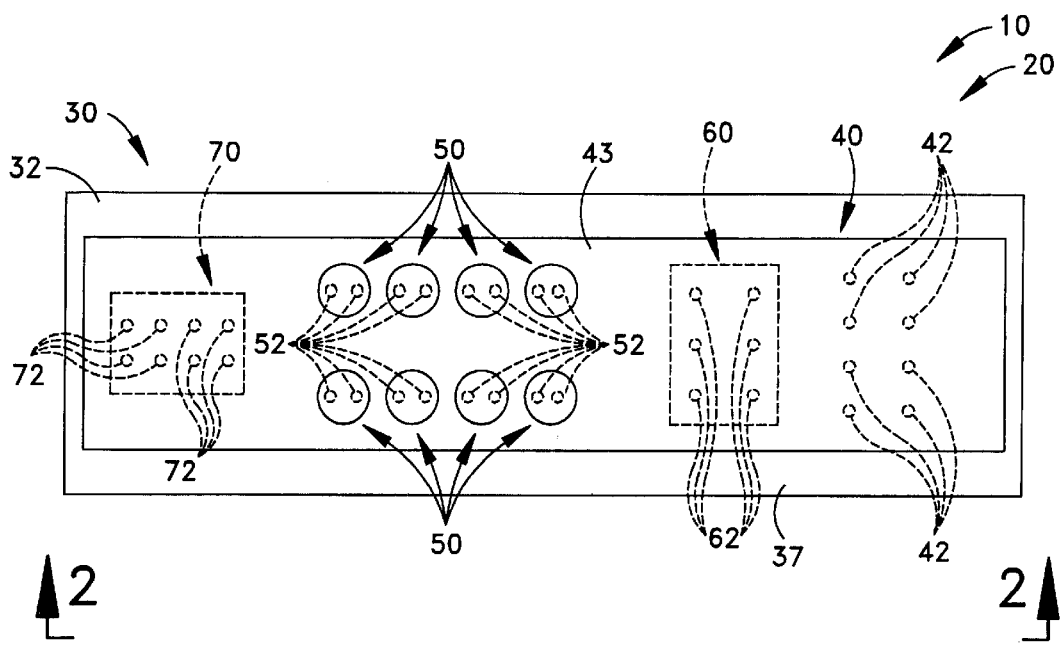
FIG. 1 is a schematic view of an assembly in accordance with the present invention.

In accordance with one embodiment of the present invention, an anti-lock braking system 10 includes an integrated electronic assembly 20. The assembly 20 comprises a printed circuit board 30, a lead frame 40, a plurality of solenoid coils 50, a first component 60, and a second component 70. The first component 60 may be a motor connector for the anti-lock braking system 10. The second component 70 may be another component for the anti-lock braking system 10.

The circuit board 30 has a planar first surface 32 and a planar second surface 34 opposite the first surface. The lead frame 40 has a planar first surface 43 and a planar second surface 44 opposite the first surface of the lead frame. The lead frame 40 further has a set of mechanical one-way connectors 42, such as non-soldered compliant pins, extending from the second surface 44 of the lead frame. The set of connectors 42 engages a corresponding set of apertures, or engagement holes 36, in the first surface 32 of the circuit board 30. The engagement holes 36 are located adjacent an edge 37 of the first surface 32 of the circuit board 30.

As viewed in FIG. 1, the set of connectors 42 and corresponding engagement holes 36 are typically arranged in two rows in order to conserve space on the first surface of the circuit board 30. The use of non-soldered connectors allows the lead frame 40 to be easily mounted on the circuit board 30 subsequent to the mounting of the plurality of solenoid coils 50 to the lead frame while also conserving space on the first surface 32 of the circuit board.

Each of the plurality of solenoid coils 50 has two solenoid connectors 52, such as solderable connectors (FIG. 2) or non-soldered compliant pins (not shown). The solderable solenoid connectors are typically inserted completely through engagement holes in the first surface 43 of the lead frame 40 and secured to the lead frame by solder 54 on the second surface 44 of the lead frame, as is known in the art.

The circuit board 30 thereby provides means for electrical connection and support to the lead frame 40 and the plurality of solenoid coils 50. Since the mechanical one-way connectors 42 of the lead frame 40 plastically deform when inserted into the engagement holes 36 of the circuit board 30, no access to the second surface 34 of the circuit board is necessary for mounting the lead frame to the circuit board. This arrangement may allow the circuit board 30 to be up to half the size of a circuit board utilizing the conventional arrangement (i.e., the solenoid coils mounted directly to the circuit board).

Figure 2:
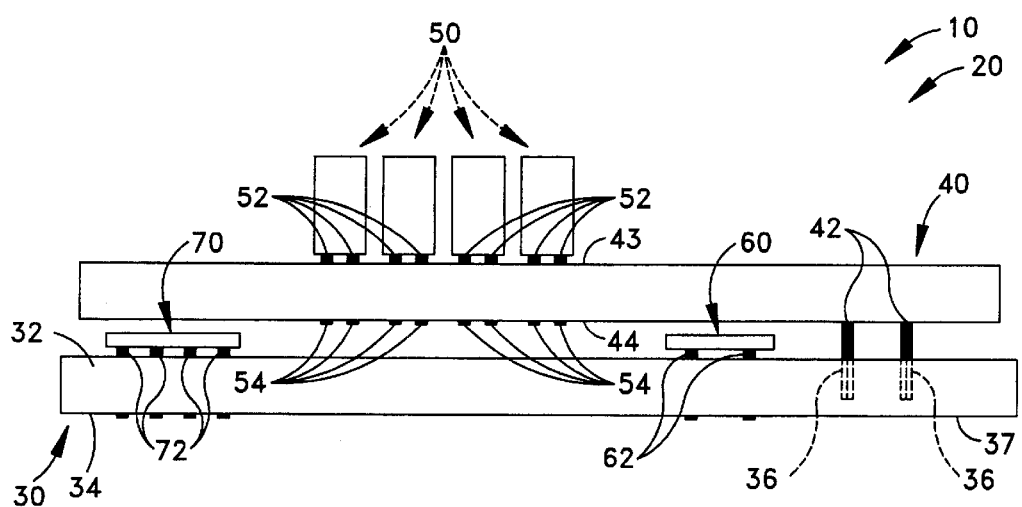
FIG. 2 is a schematic section view taken along line 2—2 in FIG. 1.

As viewed in FIGS. 1 and 2, the mounting of the lead frame 40 adjacent the edge 37 of the first surface 32 of the circuit board 30 allows greater mounting area on the first surface for other components than the conventional arrangement. The first component 60 is mounted to the first surface 32 of the circuit board 30 between the circuit board and the lead frame 40. The first component 60 has a set of connectors 62, such as solderable connectors or non-soldered compliant pins (not shown).

The second component 70 is mounted to the first surface 32 of the circuit board 30 between the circuit board and the lead frame 40. The second component 70 has a set of connectors 72, such as solderable connectors or non-soldered compliant pins (not shown). Other components of the anti-lock braking system 10 may be mounted to the second surface 34 of the circuit board 30 in order to further conserve space and reduce the overall size of the circuit board and the entire anti-lock braking system 10.

In accordance with another feature of the present invention, the assembly includes circuit board means, lead frame means, and a plurality of coil means. The circuit board means may be the circuit board 30 described above, a wiring harness, or other type of electrical routing arrangement. The lead frame means may be the lead frame 40 described above, a wiring harness, or other type of electrical routing arrangement. The coil means may be the solenoid coil(s) described above or other electrical actuating device(s) for operating the hydraulic valves of the anti-lock braking system 10.

The circuit board means provides electrical connection and support to the anti-lock braking system 10. The lead frame means connects to the circuit board means. The lead frame means has a plurality of mechanical one-way connectors 42 electrically connected to the circuit board means. The plurality of coil means controls respective valves of the anti-lock braking system 10. The plurality of coil means is connected to the lead frame means. Each of the plurality of coil means has connector means for electrically connecting to the lead frame means. The connector means may be the mechanical one-way connectors 52 or solderable pins described above, hardwire connectors, or other type of electrical connection devices.

In accordance with still another feature of the present invention, a method secures solenoid coils 50 of an anti-lock braking system 10. The method includes the step of mounting a plurality of the solenoid coils 50 to a lead frame 40 for electrically connecting the plurality of solenoid coils to the lead frame. The method further includes the step of mounting the lead frame 40 to a circuit board 30 for electrically connecting the lead frame to the circuit board. The mounting of the lead frame 40 includes the step of inserting a plurality of mechanical one-way connectors 42 into the circuit board 30.

From the above description of the invention, those skilled in the art will perceive improvements, changes and modifications. Such improvements, changes and modifications within the skill of the art are intended to be covered by the appended claims.

Having described the invention, the following is claimed:

1. An assembly for an anti-lock braking system, said assembly comprising:

a circuit board having a plurality of engagement connector holes;

a lead frame having a plurality of mechanical one-way connectors, each one-way connector having an associated engagement connector hole in said circuit board for providing an electrical connection between said circuit board and said lead frame; and a plurality of solenoid coils connected to said lead frame, each of said plurality of solenoid coils being electrically connected to associated ones of said one-way connectors such that each of said plurality of solenoid coils is electrically connected to said circuit board.

2. The assembly as set forth in claim 1 wherein said plurality of connectors of said lead frame are compliant pins.

3. The assembly as set forth in claim 1 wherein said plurality of solenoid coils is connected to said lead frame by solderable connectors.

4. The assembly as set forth in claim 1 wherein said plurality of connectors of said lead frame are arranged in rows extending from said lead frame.

5. The assembly as set forth in claim 1 wherein each of said plurality of solenoid coils has a pair of solenoid connectors connected to said lead frame.

6. The assembly as set forth in claim 5 wherein each of said pairs of solenoid connectors corresponds to a pair of said plurality of connectors of said lead frame.

7. A method for securing solenoid coils of an anti-lock braking system, said method comprising the steps of:

mounting a plurality of solenoid coils to a lead frame for electrically connecting the plurality of solenoid coils to the lead frame; and mounting the lead frame to a circuit board for electrically connecting the lead frame to the circuit board, said mounting of the lead frame including the step of inserting a plurality of mechanical one-way connectors into the circuit board.

* * * * *